US009761972B2

(12) United States Patent
Beucler et al.

(10) Patent No.: US 9,761,972 B2
(45) Date of Patent: Sep. 12, 2017

(54) RADIO FREQUENCY CONNECTOR AND ASSEMBLY HAVING MICRO-VIA RADIAL INTERCONNECT

(71) Applicant: MERCURY SYSTEMS, INC., Chelmsford, MA (US)

(72) Inventors: Philip Beucler, Danville, NH (US); Daniel Coolidge, Hollis, NH (US); Darryl J. McKenney, Londonderry, NH (US); Kevin Jorczak, Walpole, MA (US)

(73) Assignee: MERCURY SYSTEMS, INC., Andover, MA (US)

( * ) Notice: Subject to any disclaimer, the term of this patent is extended or adjusted under 35 U.S.C. 154(b) by 0 days.

(21) Appl. No.: 15/200,695

(22) Filed: Jul. 1, 2016

(65) Prior Publication Data

US 2017/0149156 A1    May 25, 2017

Related U.S. Application Data

(63) Continuation-in-part of application No. 14/952,242, filed on Nov. 25, 2015.

(51) Int. Cl.
*H01R 9/05* (2006.01)
*H01R 12/71* (2011.01)
(Continued)

(52) U.S. Cl.
CPC ........... *H01R 12/716* (2013.01); *H01R 12/58* (2013.01); *H01R 13/652* (2013.01);
(Continued)

(58) Field of Classification Search
CPC .. H01R 12/716; H01R 13/6315; H01R 12/58; H01R 13/652; H01R 13/5205;
(Continued)

(56) References Cited

U.S. PATENT DOCUMENTS 3,246,386 A    4/1966 Ende
3,325,752 A  * 6/1967 Barker .................... H01P 5/085
                                                    333/260

(Continued)

FOREIGN PATENT DOCUMENTS

WO    2009/057614 A1    5/2009

OTHER PUBLICATIONS

International Search Report, PCT/US2016/063260, dated Mar. 20, 2017, 14 pages.

*Primary Examiner* — Jean F Duverne
(74) *Attorney, Agent, or Firm* — Nelson Mullins Riley & Scarborough LLP

(57) ABSTRACT

An RF connector includes a conductive pin for carrying an RF signal. The conductive pin has a first longitudinal end that serves to interface with a male RF connector to receive the RF signal. The pin also includes a second longitudinal end for connecting with a printed circuit board (PCB). The second longitudinal end may be tapered, and the pin may have a groove formed above the tapered end. A housing encircles the conductive pin. The housing is shaped and sized to accept the male RF connector. A grounding element may be positioned on the bottom of the housing. The grounding element is to contact the PCB when the connector is connected to the PCB. The grounding element may be ring-shaped and soldered to the housing or epoxied to the housing.

21 Claims, 9 Drawing Sheets

(51) Int. Cl.
*H01R 12/58* (2011.01)
*H01R 13/652* (2006.01)
*H05K 1/18* (2006.01)
*H05K 3/34* (2006.01)
*H05K 1/02* (2006.01)
*H05K 1/11* (2006.01)

(52) U.S. Cl.
CPC ............ *H05K 1/0237* (2013.01); *H05K 1/11* (2013.01); *H05K 1/181* (2013.01); *H05K 3/34* (2013.01); *H05K 2201/10098* (2013.01); *H05K 2201/10189* (2013.01)

(58) Field of Classification Search
CPC ......... H01R 12/16; H05K 2201/10098; H05K 1/181; H05K 3/34; H05K 2201/10189; H05K 1/0237; H05K 1/11
USPC ........................................................ 439/578
See application file for complete search history.

(56) References Cited

U.S. PATENT DOCUMENTS

| | | | |
|---|---|---|---|
| 4,787,853 A | 11/1988 | Igarashi | |
| 5,516,303 A * | 5/1996 | Yohn | H01R 13/6315 439/248 |
| 6,146,156 A | 11/2000 | Yang | |
| 7,155,821 B1 | 1/2007 | Downes et al. | |
| 7,880,291 B2 | 2/2011 | Park et al. | |
| 8,113,884 B2 * | 2/2012 | Matsuzaki | H01R 12/716 439/607.57 |
| 8,153,900 B2 | 4/2012 | Takeuchi et al. | |
| 8,379,402 B2 | 2/2013 | Oshima et al. | |
| 8,536,696 B2 | 9/2013 | Hirose et al. | |
| 8,796,559 B2 | 8/2014 | Baek et al. | |
| 8,808,026 B2 * | 8/2014 | Yamaguchi | H01R 13/5202 439/559 |
| 2001/0015491 A1 | 8/2001 | Shiraishi | |
| 2002/0195271 A1 | 12/2002 | Gailus | |
| 2004/0182604 A1 | 9/2004 | Alcoe | |
| 2011/0061910 A1 | 3/2011 | Sung et al. | |
| 2011/0067899 A1 | 3/2011 | Choi et al. | |

* cited by examiner

RADIO FREQUENCY CONNECTOR AND ASSEMBLY HAVING MICRO-VIA RADIAL INTERCONNECT

CROSS-REFERENCE TO RELATED APPLICATIONS

This is a continuation-in-part of U.S. patent application Ser. No. 14/952,242, entitled "Soldered Interconnect for a Printed Circuit Board having an Angular Radial Feature," filed on Nov. 25, 2015, the contents of which are incorporated herein.

BACKGROUND

An electrical connector is an electro-mechanical device for joining electrical circuits or electrical components using a mechanical assembly. Connectors typically have male components designated as "plugs" and female components designated as "jacks." The electrical connectors may be used to interconnect components carrying a wide variety of signal types, including radio frequency (RF) signals.

BRIEF SUMMARY

In accordance with a first aspect of the present invention, a female RF connector is provided. The RF connector includes a conductive pin for carrying an RF signal. The conductive pin has a first longitudinal end that serves to interface with a male RF connector to receive the RF signal. The pin also includes a second longitudinal end for connecting with a printed circuit board (PCB). The second longitudinal end may be tapered, and the pin may have a groove formed above the tapered end. A housing encircles the conductive pin. The housing is shaped and sized to accept the male RF connector. A grounding element may be positioned on the bottom of the housing. The grounding element is to contact the PCB when the connector is connected to the PCB. The grounding element may be ring-shaped and soldered to the housing or epoxied to the housing. The connector may include dielectric material positioned between the conductor pin and the housing to retain the conductor pin. The connector may also include anchoring pins positioned around the periphery of the bottom of the housing for anchoring the connector to the PCB. The connector may be a sub-miniature push-on (SMP) connector.

The connector may be part of an assembly that includes a PCB. The PCB may include electrical contacts for contacting the grounding element of the connector. The PCB may also include a tapered surface interconnect that has at least one tapered sidewall that is sized and configured to receive a second longitudinal end of the conductive pin of the connector as well as solder to interconnect the connectors and the PCB. The tapered surface interconnect may be plated hole on the PCB. The inclination of the at least one tapered sidewall may be at an angle up to 15°.

DETAILED DESCRIPTION

The exemplary embodiments provide an improved connector and assembly that deploys micro-via radial interconnect technology. the connector and the assembly provide a very low loss and low radiated leakage connector to a pcb. the assembly and the connected are configured to be rugged and are suitable for harsh environments.

In one conventional approach an electrical connector for receiving an RF signal is coupled to a printed circuit board (PCB) by positioning the connector on a compression mount and screwing the mount to the PCB. Unfortunately, this approach does not always create a tight electrical connection between the connector and the PCB. Moreover, in rugged environments, vibrations and thermal extremes may cause the connector to have a worsening connection with the PCB over time. The assemblies of the exemplary embodiments provide a rugged connector that can withstand harsh environments with temperature extremes and high levels of vibration while still maintaining a sound electrical interconnection between the connector and the PCB. Moreover, the connector is designed to maintain the interconnected state due to use of the micro-via radial interconnect technology described below. Still further, the exemplary embodiments provide a robust grounding element that may provide electrical interconnect between the connector and the PCB over an area than spans 360°. The grounding element may be realized as an annular or ring-shaped element.

Figure 1A:
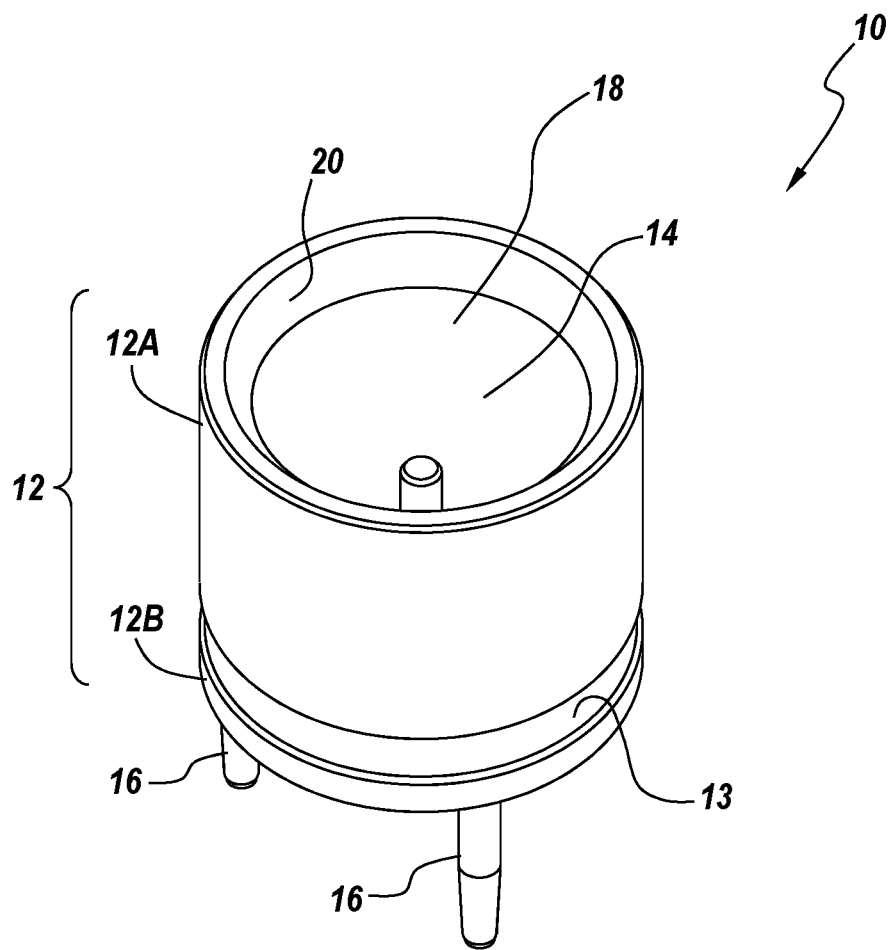
FIG. 1A depicts a perspective view of an exemplary RF connector.

FIG. 1A shows a first perspective view of an exemplary electrical connector 10 for use in the assemblies described herein. The electrical connector 10 shown in FIG. 1A includes a housing 12 having an upper portion 12A and a lower portion 12B separated by a groove 13. The upper portion 12A of the housing 12 is configured to form a socket 18 having a conductive pin 14 positioned in the center of the cup-like socket. A bevel 20 may be provided on the upper portion of the socket to facilitate insertion of a plug. Those skilled in the art will appreciate that the housing 12 may be made of a suitable material, such as metal, like brass or stainless steel. The resulting socket 18 may receive a plug for transmitting a RF signal that conducts to the conductive pin 14. The conductive pin 14 acts as an interface with the plug at a first longitudinal end and carries the RF signal to the PCB at a second longitudinal end. The conductive pin 14 may be made of a conductive material such as, beryllium copper.

Figure 1B:
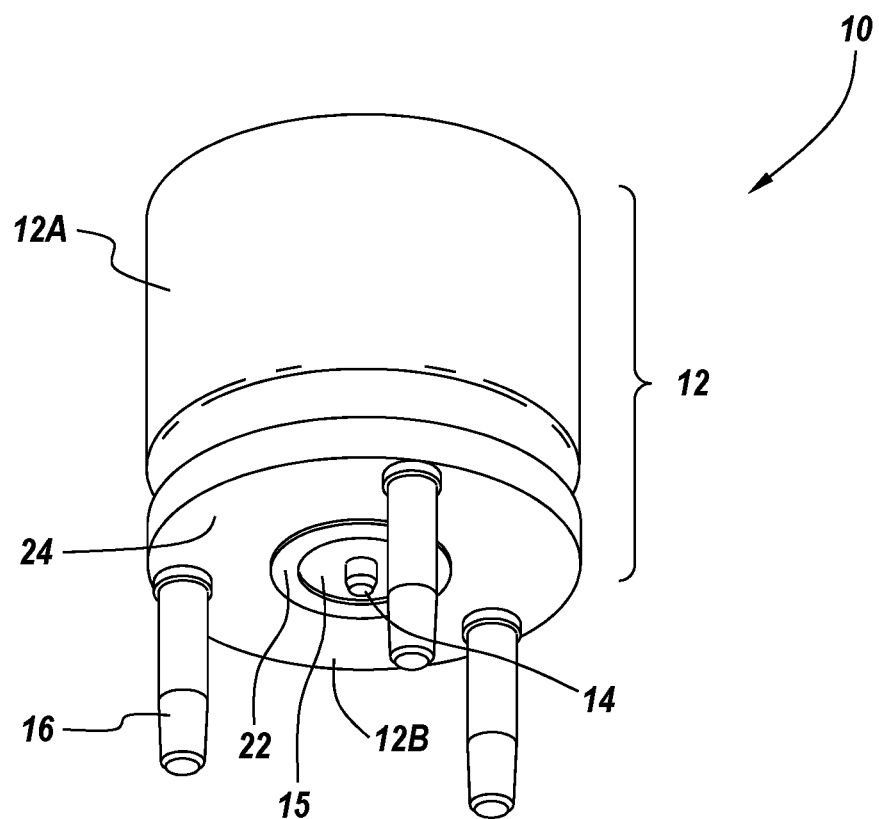
FIG. 1B shows another perspective view of the exemplary RF connector.

The lower portion 12B of the housing 12 may have posts 16 affixed to the bottom of the lower portion. In the exemplary connector 10 shown in FIGS. 1A and 1B, there are three posts positioned along the periphery of the bottom side of the lower portion of the housing 12B. The number of posts may vary. For example, two post or four posts may be used. FIG. 1B depicts three posts 16. The posts 16 are equally spaced along the underside 24 of the lower portion 12B of the housing 12. The conductive pin 14 extends through to extend beyond the bottom 24 of the lower housing 12B. Dielectric material 15 may be positioned around the conductive pin to create low loss and to provide an insulative effect that helps to reduce leakage of the signal from the pin 14. A suitable dielectric is polytetraflouroethylene (PTFE).

The bottom 24 side of the lower portion 12B of the housing 12 may have a grounding element 22 affixed thereto. The housing 12 serves as a ground conduit. The grounding element 22 is designed to electrically connect with electrical contacts on the PCB when the assembly is fully interconnected. As shown in FIG. 1B, the grounding element 22 may take the form of a ring and may provide electrical contact over an area spanning 360°. Those skilled in the art will appreciate that the grounding element 22 need not be a closed ring element, but may be an open ring element and may only occupy arcuate portions that sweep through less than 360°. Still further, those skilled in the art will appreciate different shapes and forms for the grounding element 22. For instance, the grounding element 22 may be oval, square, or rectangular and need not be continuous but rather may be formed by multiple discrete elements. The grounding element 22 provides a continuous shield around the conductive pin 14 to reduce signal leakage.

Figure 2A:
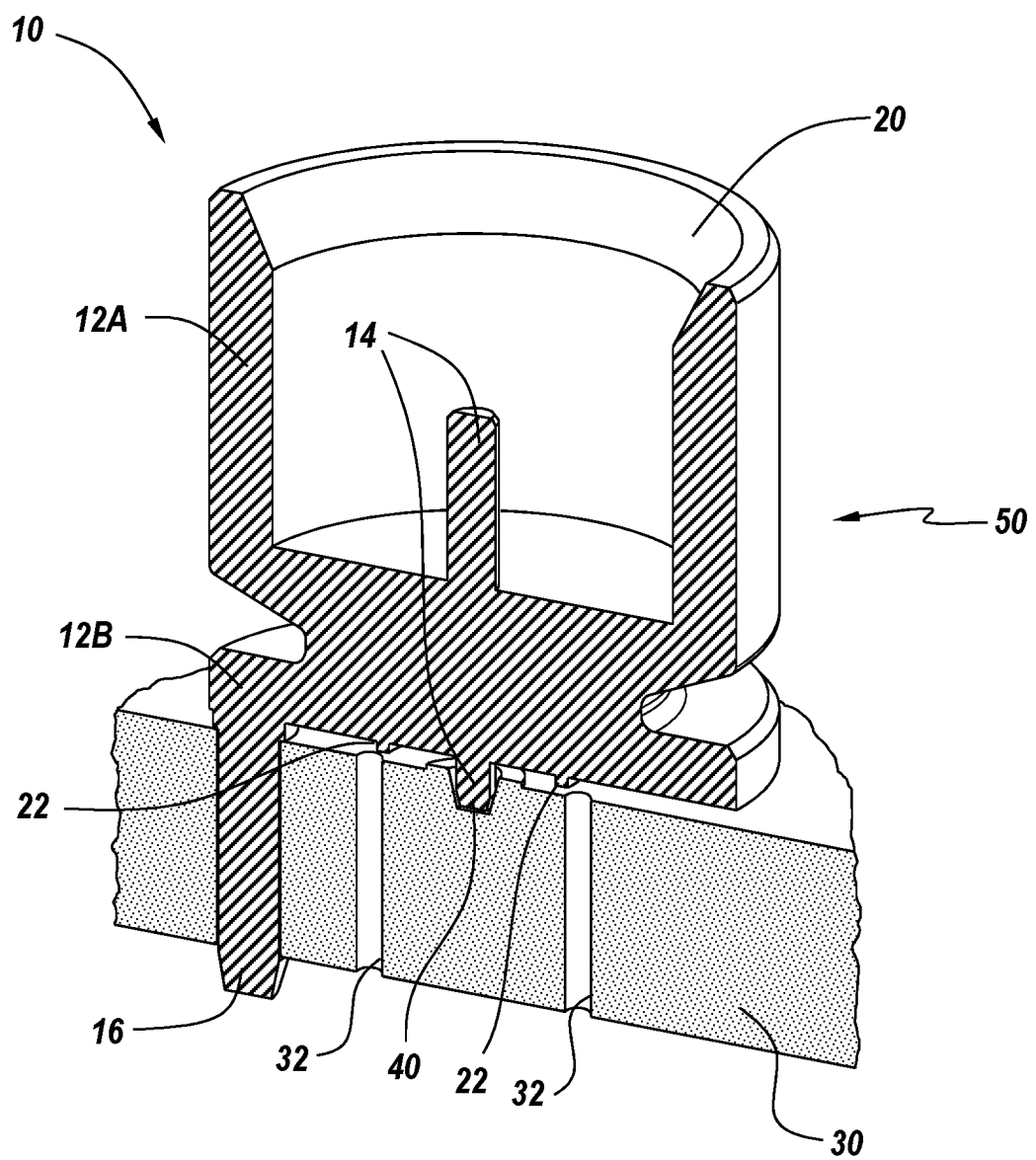
FIG. 2A is a cross-sectional view of the exemplary RF connector.
Figure 2B:
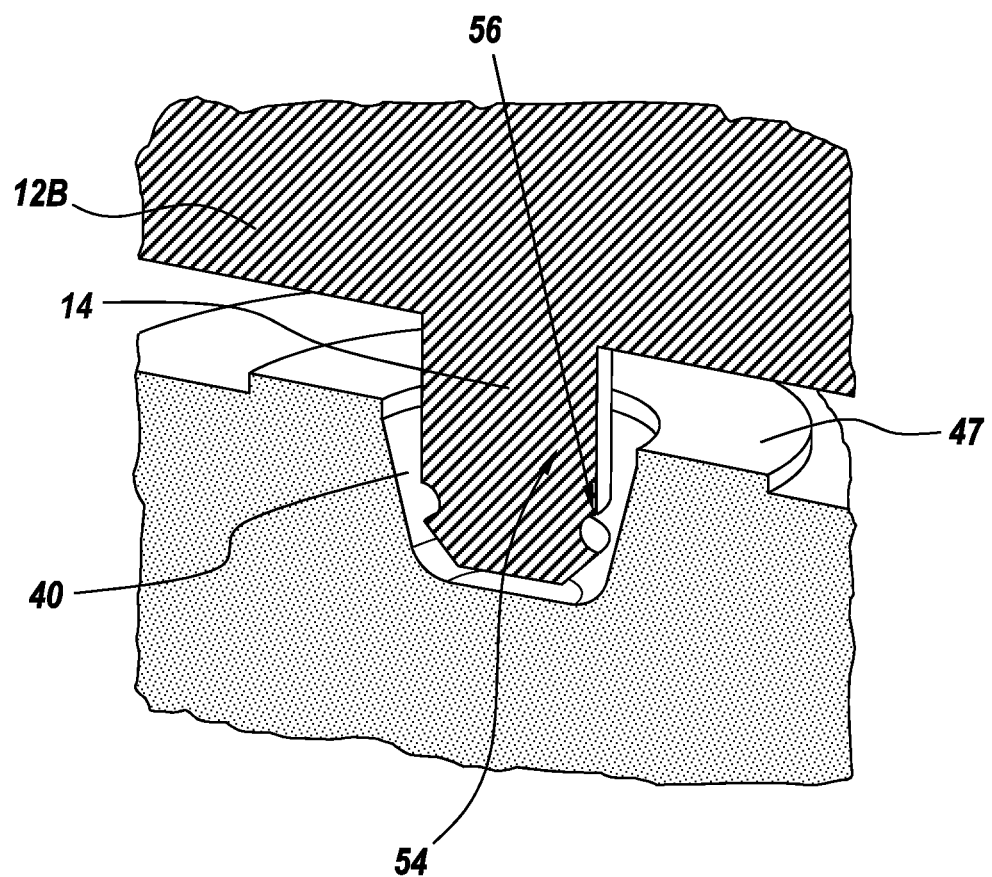
FIG. 2B shows an enlarged view of a second longitudinal end of the conductive pin of the connector in a plated micro-via on the PCB.

FIG. 2A shows a cross section of the connector 10 and the printed circuit board 30 forming an assembly 50. As can be seen in FIG. 2A, the posts 16 pass into channels or passageways in the PCB 30. The PCB may include electrical contacts 32, such as vias, that are designed to electrically couple with the grounding element 22. The conductive pin 14 is positioned in a micro-via radial interconnect 40. FIG. 2B shows the positioning of the second longitudinal end 54 of the conductive pin 14 within the micro-via radial interconnect 40. The second longitudinal end 54 of the conductive pin 14 may include a groove 56 shown in FIG. 2B. The micro-via radial interconnect may be surrounded on the top surface of PCB with plating 47.

Figure 3:
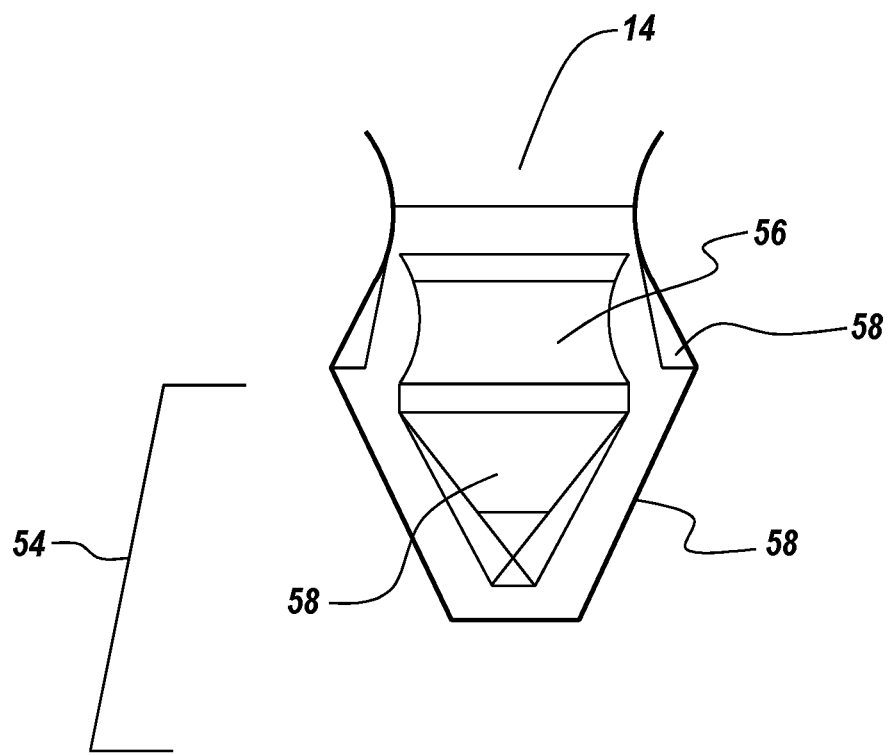
FIG. 3 depicts an exemplary geometry for the second end of the conductive pin of the RF connector.

FIG. 3 shows one exemplary geometry for the second longitudinal end 54 of the conductive pin 14. The second longitudinal end 54 is configured to have a taper and a circumferential groove 56 like those found in a French gothic fence post. The groove 56 helps to provide a neck to prevent the conductive pin 14 from decoupling from the PCB 30. In particular, the groove 56 may hook into solder 58 provided around the groove 56 to prevent decoupling and strengthening the interconnection. The taper may be present on the multiple sides of the second longitudinal end 54 of the conductive pin 14.

Figure 4:
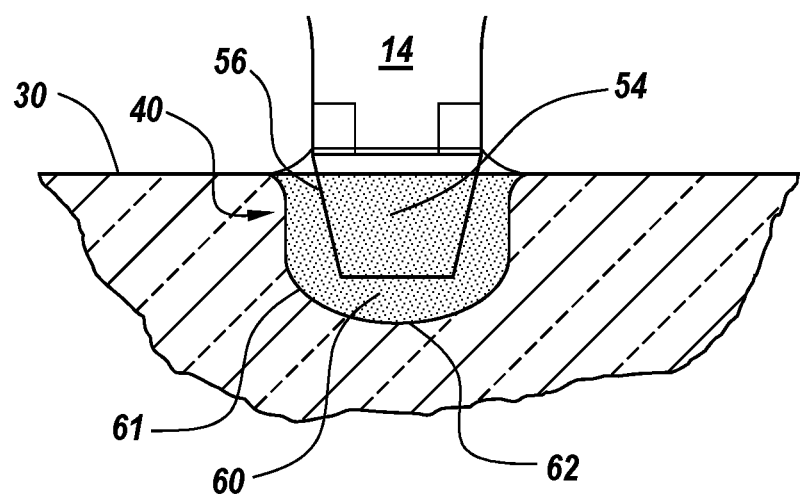
FIG. 4 depicts the second longitudinal end of the conductive pin of the RF connector in a rounded bottomed micro-via on the PCB with solder in place to form an interconnect.

As was mentioned above, the second longitudinal end 54 of the conductive pin is positioned in the micro-via radial interconnect 40 and secured via solder 60 as shown in FIG. 4. The micro-via interconnect 40 has a tapered sidewall 61 and may have a rounded bottom surface 62 rather than a flat bottom surface. Thus, the bottom surface 62 of the interconnect 40 may be flat or concave. This makes it so that the pin 14 with its tapered wall 56 is less likely to be damaged during insertion and helps prevent voids in the solder 60 while allowing the flux to more efficiently evacuate.

The micro-via radial interconnect technology is described in more detail in U.S. patent application Ser. No. 14/952,242, and incorporated by reference herein.

Figure 5:
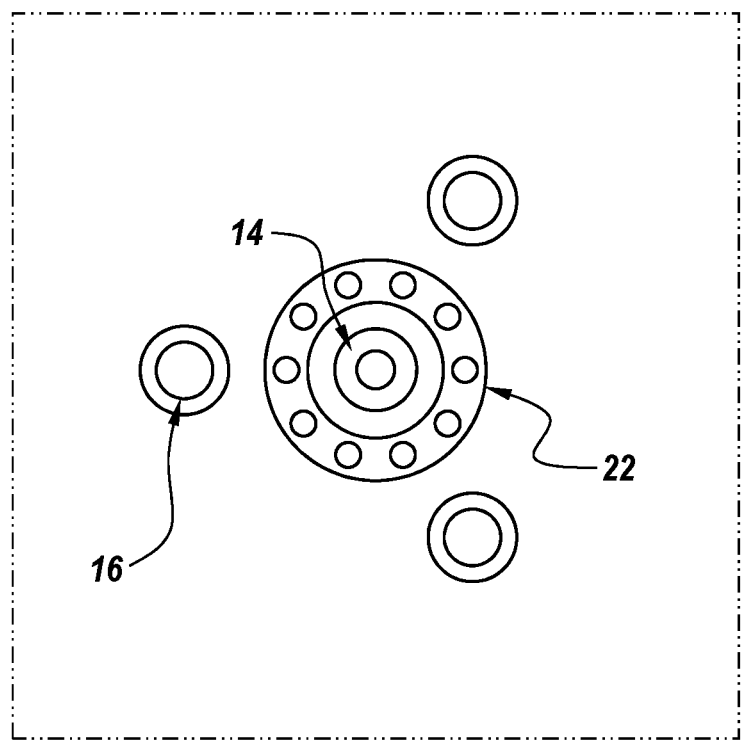
FIG. 5 illustrates the footprint of the RF connector that interfaces with the PCB.

FIG. 5 depicts the footprint of the connector 10 relative to the PCB 30. The footprint includes the posts 16 as well as the grounding element 22 and the conductive pin 14. These components all interface with the PCB.

Figure 6:
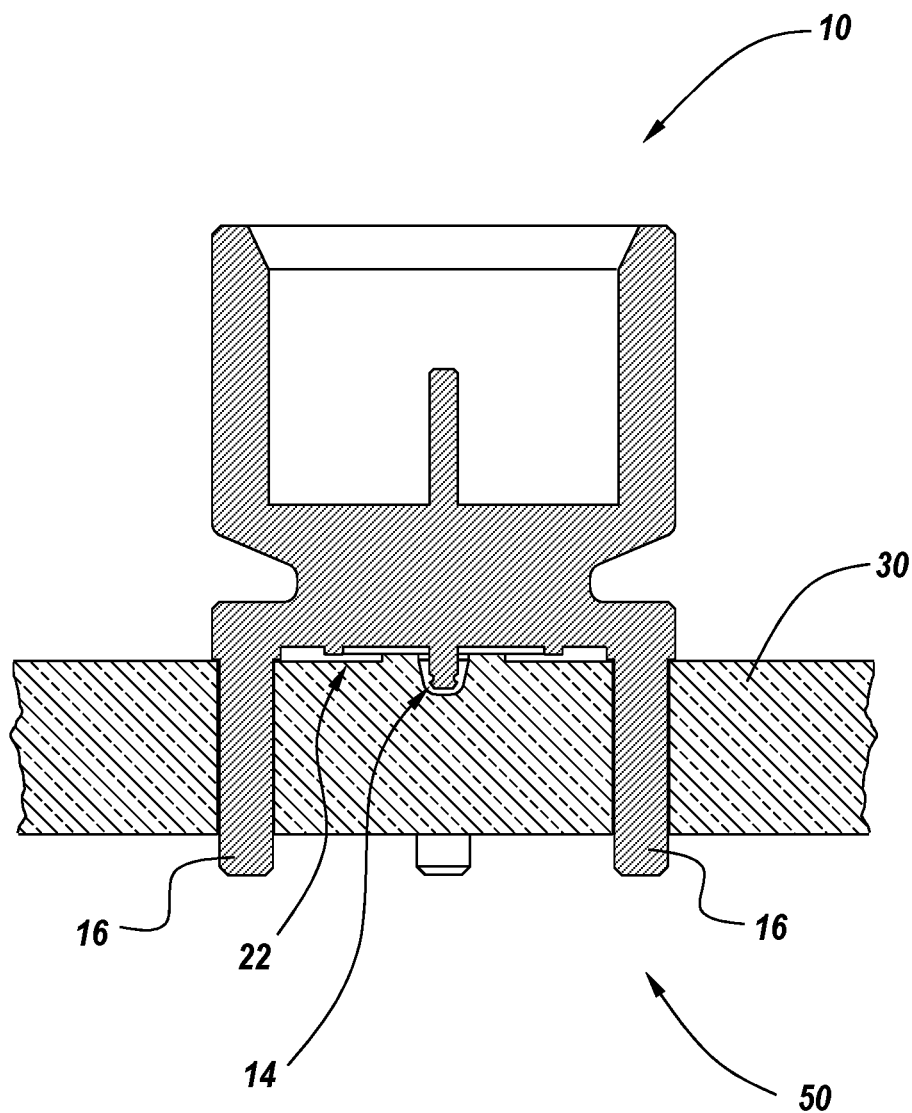
FIG. 6 illustrates an exemplary assembly that includes the RF connector and the PCB from a cross-sectional perspective.

FIG. 6 provides a cross-sectional view of the assembly 50. As can be seen in FIG. 6, the posts 16 extend into the PCB 30 via channels or other passageways. The conductive pin 14 rests within the micro-via radio interconnect and an electrical connection is created with the connective pin 14 as well as the grounding element 22.

Figure 7:
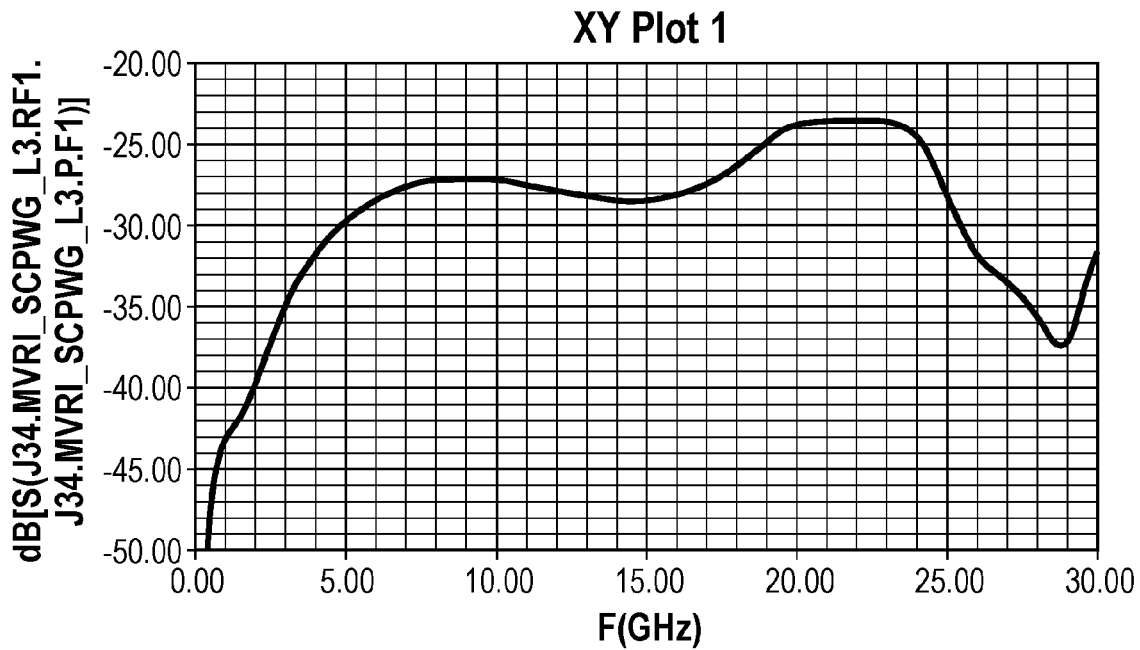
FIG. 7 is a plot of return loss of the footprint of the interconnect.
Figure 8:
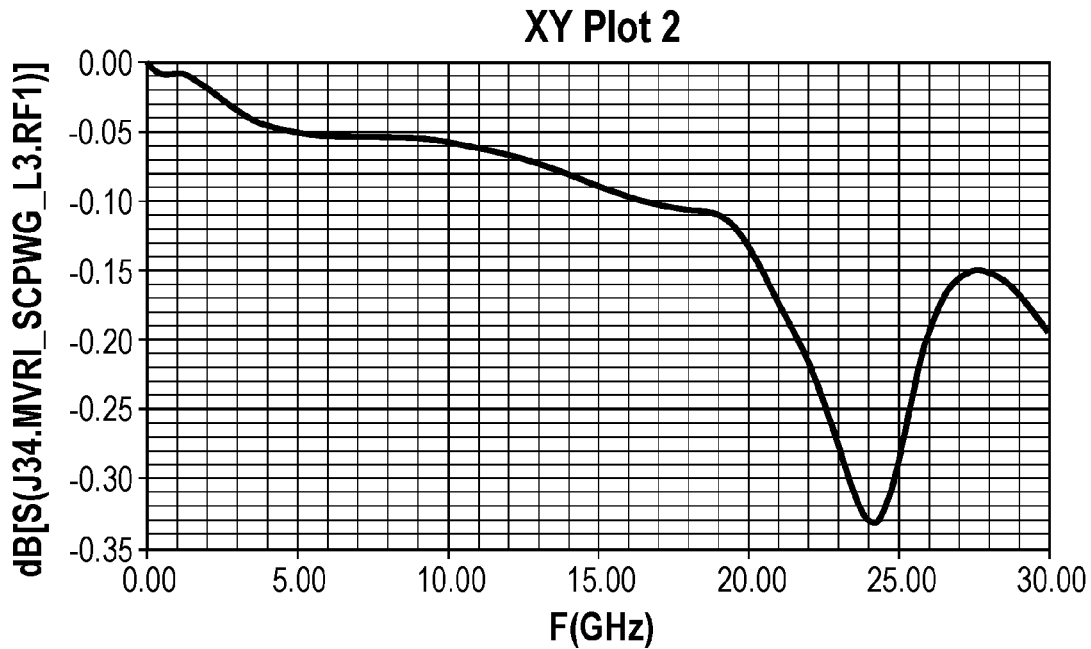
FIG. 8 is a plot of insertion loss of the footprint of the interconnect.

FIG. 7 depicts the improved electrical performance of the connector by illustrating the return loss of the footprint of the connector. This is a reflection of the loss of power due to discontinuities. FIG. 8 shows the insertion loss of the connector. This represents the loss of signal power due to the inserted devices (i.e. the connector and interconnector). These plots plot loss in decibels relative to frequency.

It will be appreciated that the present invention is not limited to a SMP connector or assemblies that use SMP connectors. Other types of connectors may be used, such as sub-miniature version A (SMA) connectors. Moreover, the present invention is not limited to use of surface mount connectors; rather other connector types, such as edge launch and 90° connectors may be used.

While the present invention has been described with reference to exemplary embodiments described herein, those skilled in the art will appreciate that various changes in form and detail may be made without departing from the intended scope of the invention as defined in the appended claims.

The invention claimed is:

1. A female radio frequency (RF) connector, comprising a conductive pin for carrying an RF signal, the conductive pin having:
   a first longitudinal end to interface with a male RF connector to receive the RF signal, and
   a second longitudinal end for connecting with a printed circuit board (PCB), the second longitudinal end having a circumferential groove encircling the second longitudinal end to provide a neck to help prevent decoupling with the PCB and having a tapered end portion positioned below the circumferential groove;
   a housing encircling the conductive pin, the housing is shaped and sized to accept the male RF connector; and
   a grounding element positioned on a bottom of the housing that is to contact the PCB when the connector is connected to the PCB.

2. The connector of claim 1, wherein the grounding element is ring shaped.

3. The connector of claim 1, wherein the grounding element is soldered to the housing.

4. The connector of claim 1, wherein the grounding element is epoxied to the housing.

5. The connector of claim 1 further comprising a dielectric material positioned between the conductive pin and the housing to retain the conductive pin.

6. The connector of claim 1 further comprising anchoring pins positioned around a periphery of the bottom of the housing for anchoring the connector to the PCB.

7. The connector of claim 1, wherein the connector is a sub-miniature push-on (SMP) connector.

8. An assembly, comprising:
a printed circuit board (PCB);
a conductive pin for carrying an RF signal, the conductive pin having:
   a first longitudinal end to interface with a male RF connector to receive the RF signal, and
   a second longitudinal end for connecting with the PCB, the second longitudinal end having a circumferential groove encircling the second longitudinal end to provide a neck to help prevent decoupling with the PCB and having a tapered end portion positioned below the circumferential groove;
a housing encircling the conductive pin, the housing shaped and sized to accept the male RF connector;
a grounding element positioned on a bottom of the housing that is to contact the PCB when the connector is connected to the PCB; and
wherein the PCB includes:
   electrical contacts for contacting the grounding element, and
   a tapered surface interconnect that has at least one tapered side wall and that is sized and configured to receive the second longitudinal end of the conductive pin of the connector and solder to interconnect the connector and the PCB.

9. The assembly of claim 8, wherein the tapered surface interconnect is a plated hole on the PCB.

10. The assembly of claim 8, wherein an inclination of the at least one tapered side wall is at an angle up to 15°.

11. The assembly of claim 8, wherein the grounding element of the connector is ring shaped.

12. The assembly of claim 11 wherein the grounding element provides 360 degrees of contact with the PCB.

13. The assembly of claim 8, wherein the grounding element is soldered to the housing.

14. The assembly of claim 8, wherein the grounding element is epoxied to the housing.

15. The assembly of claim 8, wherein the grounding element is a ring that encircles the second longitudinal end of the conductive pin of the connector.

16. The assembly of claim 8, wherein the connector further comprises dielectric material positioned between the conductive pin and the housing.

17. An assembly comprising:
a printed circuit board (PCB);
a conductive pin for carrying an RF signal, the conductive pin having:
   a first longitudinal end to interface with a male RF connector to receive the RF signal, and
   a second longitudinal end for connecting with the PCB, the second longitudinal end having a circumferential groove encircling the second longitudinal end to provide a neck to help prevent decoupling with the PCB and having a tapered end portion positioned below the circumferential groove;
a housing encircling the conductive pin, the housing shaped and sized to accept the male RF connector; and
wherein the PCB includes:
   electrical contacts, and
   a tapered surface interconnect that has at least one tapered side wall and that is sized and configured to receive the second longitudinal end of the conductive pin of the connector and solder to interconnect the connector and the PCB.

18. The assembly of claim 17 wherein the tapered surface interconnect is a plated hole on the PCB.

19. The assembly of claim 17 wherein an inclination of the at least one tapered side wall is at an angle up to 15°.

20. The assembly of claim 17 further comprising anchoring pins positioned around a periphery of a bottom of the housing for anchoring the connector to the PCB.

21. The assembly of claim 17 wherein the connector is a sub-miniature push-on (SMP) connector.

\* \* \* \* \*